(12) United States Patent
Kamgaing et al.

(10) Patent No.: US 12,489,189 B2
(45) Date of Patent: Dec. 2, 2025

(54) CONTACTLESS COMMUNICATION USING A WAVEGUIDE EXTENDING THROUGH A SUBSTRATE CORE

(71) Applicant: Intel Corporation, Santa Clara, CA (US)

(72) Inventors: Telesphor Kamgaing, Chandler, AZ (US); Neelam Prabhu Gaunkar, Chandler, AZ (US); Georgios C. Dogiamis, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 1023 days.

(21) Appl. No.: 17/349,774

(22) Filed: Jun. 16, 2021

(65) Prior Publication Data
US 2022/0407205 A1     Dec. 22, 2022

(51) Int. Cl.
*H01P 3/16*     (2006.01)
*H01L 21/48*    (2006.01)
(Continued)

(52) U.S. Cl.
CPC .............. *H01P 3/16* (2013.01); *H01L 21/486* (2013.01); *H01L 23/147* (2013.01); *H01L 23/15* (2013.01); *H01L 23/49827* (2013.01); *H01L 23/49838* (2013.01); *H01L 23/66* (2013.01); *H01P 11/006* (2013.01); *H01Q 1/2283* (2013.01); *H01Q 9/0407* (2013.01); *H01L 2223/6616* (2013.01);
(Continued)

(58) Field of Classification Search
CPC .... H01P 3/16; H01L 21/486; H01L 23/49827; H01L 2223/6616
See application file for complete search history.

(56) References Cited

U.S. PATENT DOCUMENTS

| 5,010,348 A | 4/1991 | Rene |
| 2006/0013525 A1* | 1/2006 | Murayama .......... H01S 5/02325 385/14 |

(Continued)

FOREIGN PATENT DOCUMENTS

DE      102019101276      7/2020

OTHER PUBLICATIONS

Extended European Search Report for European Patent Application No. 22173319.9 mailed Oct. 24, 2022, 10 pgs.
(Continued)

*Primary Examiner* — Marlon T Fletcher
*Assistant Examiner* — Samuel Jonathan Smith
(74) *Attorney, Agent, or Firm* — Schwabe, Williamson & Wyatt P.C.

(57) ABSTRACT

Embodiments described herein may be related to apparatuses, processes, and techniques related to contactless transmission within a package that combines radiating elements with vertical transitions in the package, in particular to a waveguide within a core of the package that is surrounded by a metal ring. A radiating element on one side of the substrate core and above the waveguide surrounded by the metal ring communicates with another radiating element on the other side of the substrate core and below the waveguide surrounded by the metal ring. Other embodiments may be described and/or claimed.

18 Claims, 11 Drawing Sheets

(51) Int. Cl.
  *H01L 23/14*   (2006.01)
  *H01L 23/15*   (2006.01)
  *H01L 23/498*  (2006.01)
  *H01L 23/66*   (2006.01)
  *H01P 11/00*   (2006.01)
  *H01Q 1/22*    (2006.01)
  *H01Q 9/04*    (2006.01)

(52) U.S. Cl.
  CPC ............... *H01L 2223/6627* (2013.01); *H01L 2223/6677* (2013.01)

(56) References Cited

U.S. PATENT DOCUMENTS

| | | |
|---|---|---|
| 2008/0297283 A1 | 12/2008 | Byun |
| 2016/0218072 A1 | 7/2016 | Liao |
| 2016/0259139 A1* | 9/2016 | Kraft .................... G02B 6/4274 |
| 2018/0019511 A1 | 1/2018 | Pancera |
| 2018/0197842 A1* | 7/2018 | Tokunari ............ H01S 5/02326 |
| 2019/0067780 A1 | 2/2019 | Kirino |
| 2020/0203293 A1 | 6/2020 | Aygun |
| 2022/0085478 A1 | 3/2022 | Karau |

OTHER PUBLICATIONS

Office Action for European Patent Application No. 22173319.9 mailed Dec. 11, 2024, 9 pgs.

Lugo Denise C et al: "Multilayer Dielectric Rod Waveguide and Dielectric Rod Antenna Multilayer Dielectric Rod Waveguide and Dielectric Rod Antenna with Enhanced Performance with Enhanced Performance", Jul. 27, 2018, XP093230326.

\* cited by examiner

CONTACTLESS COMMUNICATION USING A WAVEGUIDE EXTENDING THROUGH A SUBSTRATE CORE

FIELD

Embodiments of the present disclosure generally relate to the field of semiconductor packaging, and in particular to millimeter wave transmission within a package.

BACKGROUND

Continued growth in virtual machines and cloud computing will continue to increase the demand for semiconductor package speed and density.

DETAILED DESCRIPTION

Figure 1:
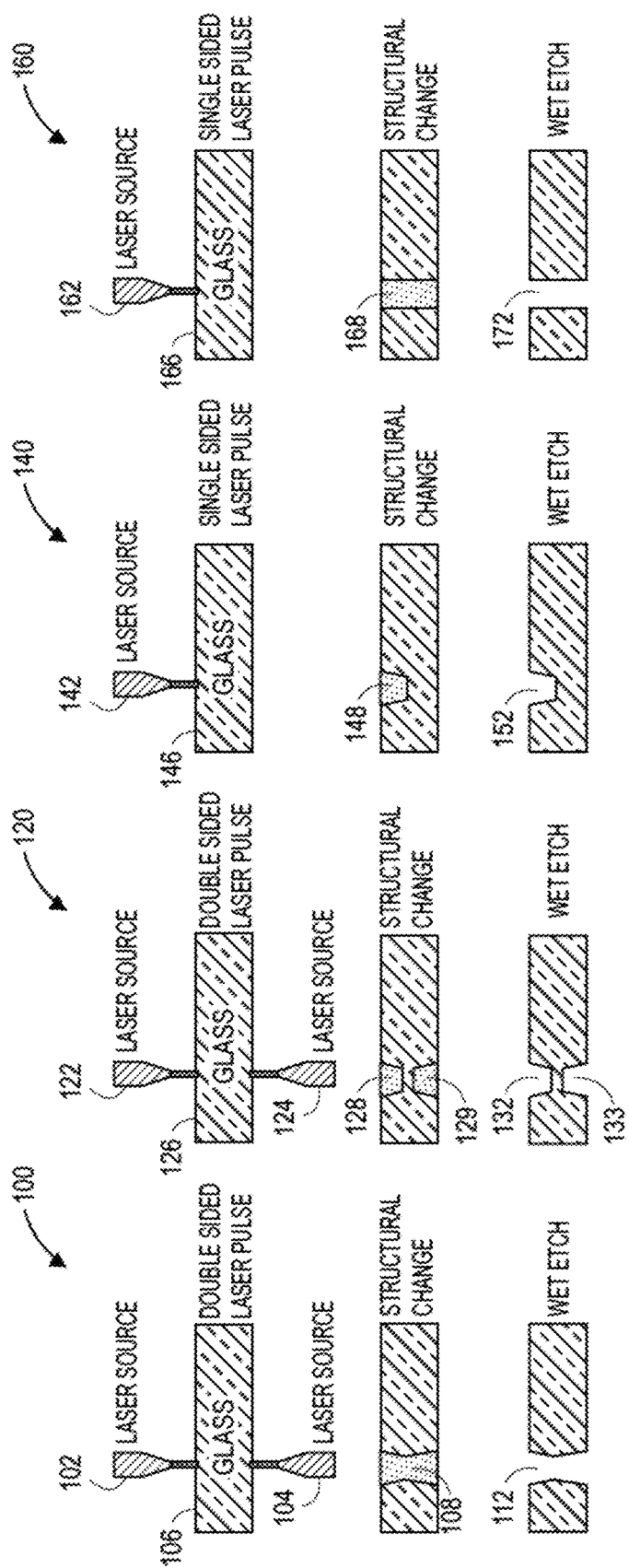
FIG. 1 illustrates multiple examples of laser-assisted etching of glass interconnects processes (which may be referred to as "LEGIT" herein), in accordance with embodiments

Embodiments described herein may be related to apparatuses, processes, and techniques related to contactless transmission within a package that combines radiating elements with vertical transitions in the package, in particular to a waveguide within a core of the package that is surrounded by a metal ring. In embodiments, a radiating element on one side of the substrate core and above the waveguide surrounded by the metal ring communicates with another radiating element on the other side of the substrate core and below the waveguide surrounded by the metal ring.

There are benefits to increasing intra-platform signaling speed. Mm-wave and sub-THz technologies may facilitate data rates in excess of 100 Gbps per link at the die level. Using mm-wave for intra platform communication requires in package channels suitable for high frequency operations.

Embodiments described herein may result in: a large bandwidth density and higher frequency of operation; a smaller footprint, up to nine times smaller, then a legacy quasi-waveguide approach using discrete plated through hole (PTH) vias; reduced cross talk through the waveguide surrounded by the metal ring; and the ability to communicate with dies on opposite sides of the substrate. Embodiments provide a contactless in-package transition that can improve bandwidth, cross talk and integration density. Embodiments will also enable package level architectures with high speed dies on different sides of the same package or on different packages.

Legacy implementations that include a through signal via or a quasi-waveguide made of discrete vias within a package core, are limited in bandwidth and cannot provide wide bandwidth channels for mm-wave and sub-THz frequency of operation.

In embodiments, a waveguide surrounded by a metal ring may be placed within a glass core of a substrate, into which through hole vias, trenches, or plated through holes may be made. One or more laser sources followed by wet-etching may be used to create through hole vias or trenches into the glass panel, glass wafer, or glass core. Using these laser techniques, vias may be created with a small diameter, for example on the order of less than 10 µm, and may be spaced with a pitch on the order of 50 µm or less. Other vias may be created with different diameter sizes. These vias may be later plated or filled to create electrical pathways through the bridge. These techniques may be used to create vias in the glass wafer or panel that have high aspects ratios, for example 40:1 or 50:1. Because of the fine pitch of the vias, more signals may be put through the BGA field at a higher density and may expand the frequency range resulting in a higher bandwidth communications. Because of the fine dimensions of the vias and the ability to create via trenches, higher isolation between neighboring signal transitions can be achieved. In addition, these techniques may reduce or eliminate impedance mismatch, which in legacy implementations may limit the frequency bandwidth of signals transmitted through the package BGA interface.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the contactless interconnect discussed herein, may also take advantage of these techniques.

Diagram 100 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 112 is created by laser pulses from two laser sources 102, 104 on opposite sides of a glass wafer 106. As used herein, a through drill and a through via refers to when the drill or the via starts on one side of the glass/substrate and ends on the other side. A blind drill and a blind via refers to when the drill or the via starts on the surface of the substrate and stops partially inside the substrate. In embodiments, the laser pulses from the two laser sources 102, 104 are applied perpendicularly to the glass wafer 106 to induce a morphological change 108, which may also be referred to as a structural change, in the glass that encounters the laser pulses. This morphological change 108 includes changes in the molecular structure of the glass to make it easier to etch out (remove a portion of the glass). In embodiments, a wet etch process may be used.

Diagram 120 shows a high level process flow for a double blind shape. A double blind shape 132, 133 may be created by laser pulses from two laser sources 122, 124, which may be similar to laser sources 102, 104, that are on opposite sides of the glass wafer 126, which may be similar to glass wafer 106. In this example, adjustments may be made in the laser pulse energy and/or the laser pulse exposure time from the two laser sources 122, 124. As a result, morphological changes 128, 129 in the glass 126 may result, with these changes making it easier to etch out portions of the glass. In embodiments, a wet etch process may be used.

Diagram 140 shows a high level process flow for a single-blind shape, which may also be referred to as a trench. In this example, a single laser source 142 delivers a laser pulse to the glass wafer 146 to create a morphological change 148 in the glass 146. As described above, these morphological changes make it easier to etch out a portion of the glass 152. In embodiments, a wet etch process may be used.

Diagram 160 shows a high level process flow for a through via shape. In this example, a single laser source 162 applies a laser pulse to the glass 166 to create a morphological change 168 in the glass 166, with the change making it easier to etch out a portion of the glass 172. As shown here, the laser pulse energy and/or laser pulse exposure time from the laser source 162 has been adjusted to create an etched out portion 172 that extends entirely through the glass 166.

With respect to FIG. 1, although embodiments show laser sources 102, 104, 122, 124, 142, 162 as perpendicular to a surface of the glass 106, 126, 146, 166, in embodiments, the laser sources may be positioned at an angle to the surface of the glass, with pulse energy and/or pulse exposure time variations in order to cause a diagonal via or a trench, or to shape the via, such as 112, 172, for example to make it cylindrical, tapered, or include some other feature. In addition, varying the glass type may also cause different features within a via or a trench as the etching of glass is strongly dependent on the chemical composition of the glass.

In embodiments using the process described with respect to FIG. 1, through hole vias 112, 172 may be created that are less than 10 μm in diameter, and may have an aspect ratio of 40:1 to 50:1. As a result, a far higher density of vias may be placed within the glass and be placed closer to each other at a fine pitch. In embodiments, this pitch may be 50 μm or less. After creating the vias or trenches, a metallization process may be applied in order to create a conductive pathway through the vias or trenches, for example a plated through hole (PTH). Using these techniques, finer pitch vias will result in better signaling, allowing more I/O signals to be put through the glass wafer and to other coupled components such as a substrate.

Figure 2:
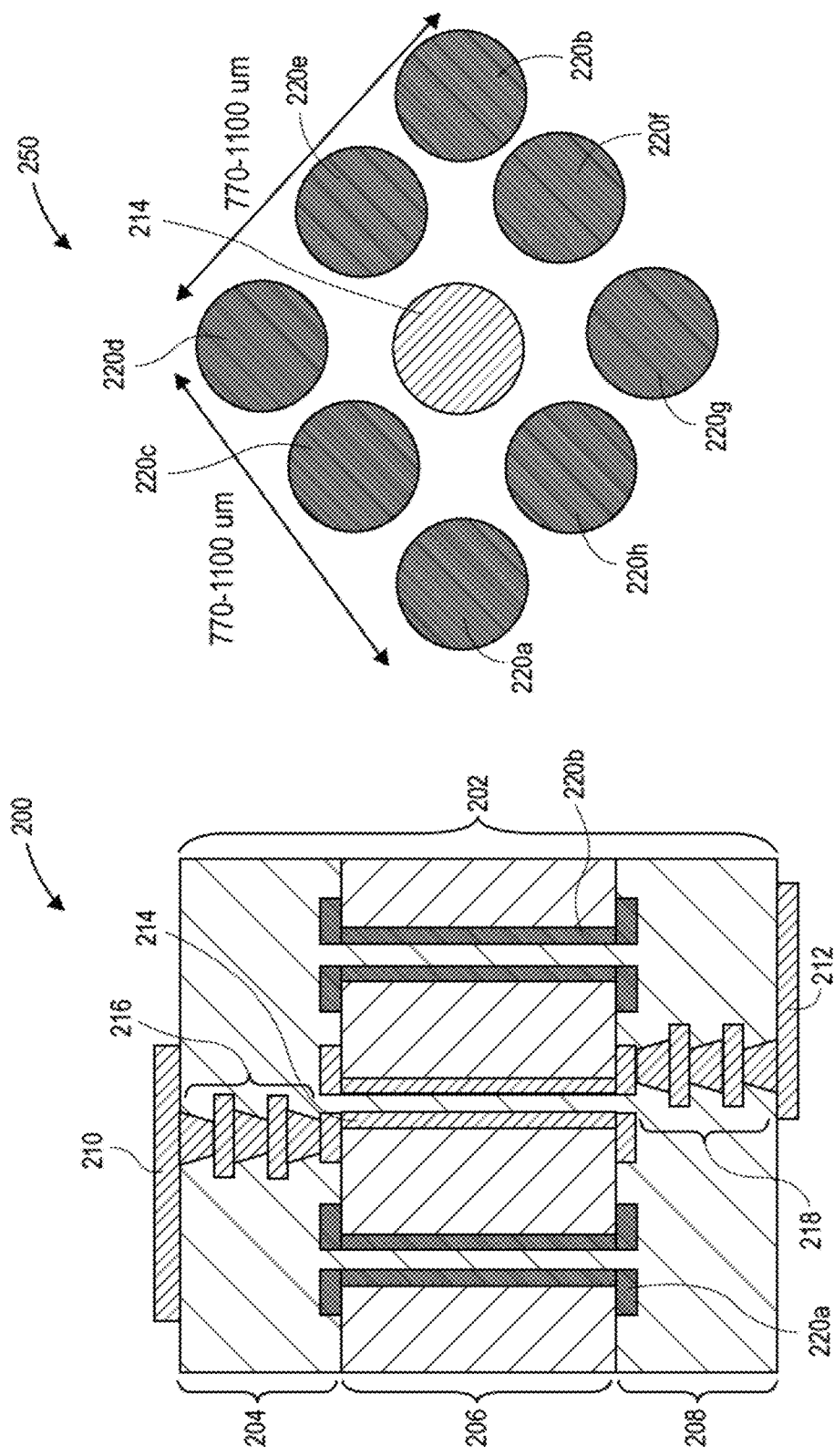
FIG. 2 illustrates a side view and a top-down view of a legacy implementation of a through-core transmission line.

FIG. 2 illustrates a side view and a top-down view of a legacy implementation of a through-core transmission line. Package 200 shows a side view of a substrate 202 that includes a first buildup layer 204 on top of the first side of a core 206, with a second buildup layer 208 on the second side of the core 206. A first routing layer 210 on top of the first buildup layer 204 is communicatively coupled with a second routing layer 212 on the bottom of the second buildup layer 208.

This is accomplished in this legacy implementation by creating a signal line 214 through the core 206 to electrically couple the first routing layer 210 with a first group of electrically coupled conductive vias 216 to the signal line 214. The second routing layer 212 is electrically coupled with the signal line 214 by way of a second group of electrically coupled conductive vias 218. Thus, the first routing layer 210 is electrically coupled with the second routing layer 212. Note that the signal line 214 is shown as a PTH. A number of grounded conductive vias 220a, 220b are placed within the core 206 and surround the signal line 214. Note that the grounded conductive vias 220a, 220b are shown as PTHs.

View 250 shows a top-down view of the core 206 that includes the grounded conductive vias 220a-220h that surround the conductive signal 214. The discrete grounded conductive vias 220a-220h form a quasi-coaxial-waveguide for the conductive signal 214. Note that view 250 shows the conductive vias 220a-220h and the signal line 214 as filled conductive vias.

Figure 3:
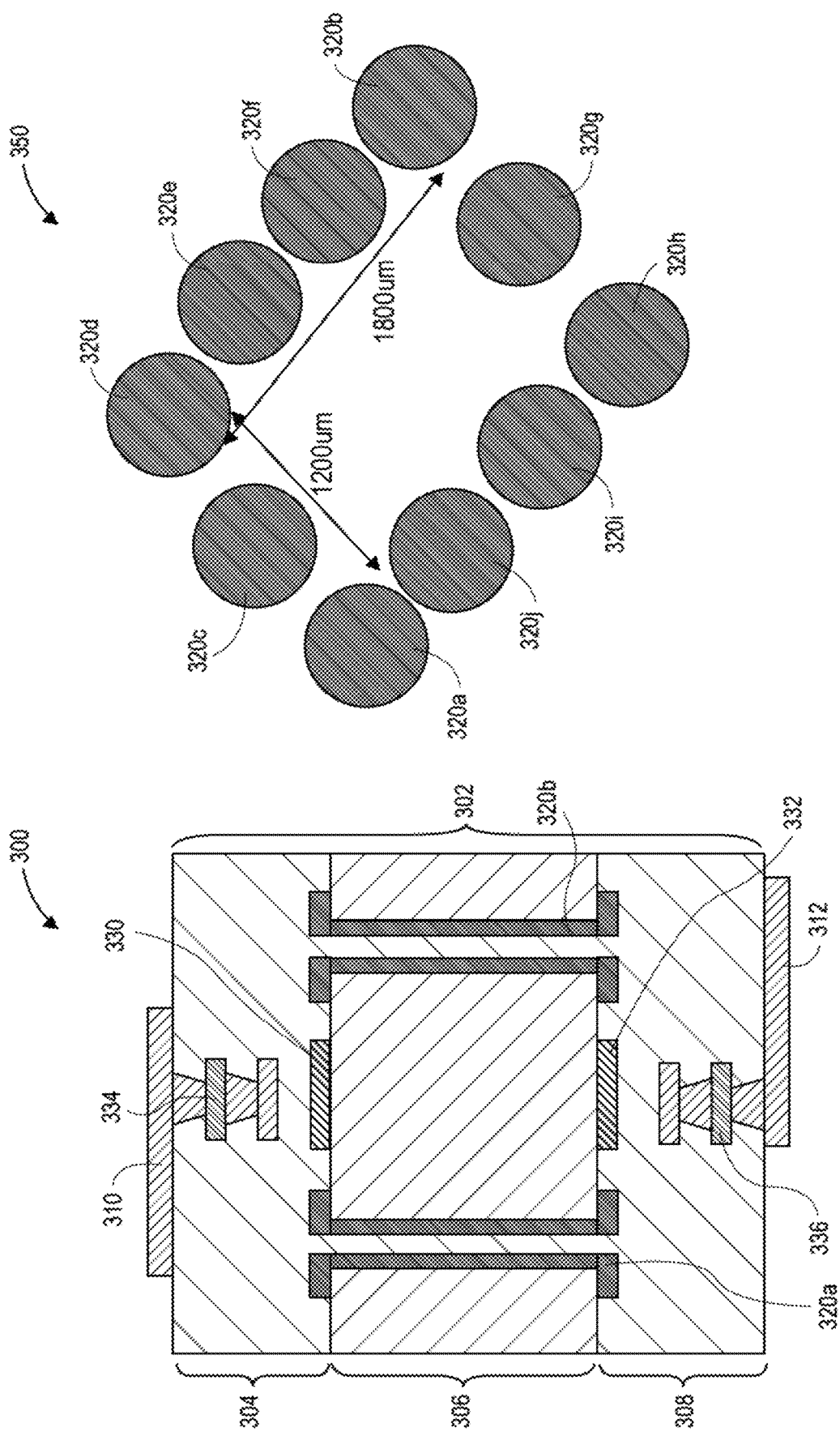
FIG. 3 illustrates a side view and a top view of a legacy implementation of a transmission line with a quasi-waveguide made of discrete vias.

FIG. 3 illustrates a side view and a top view of a legacy implementation of a transmission line with a quasi-waveguide made of discrete vias. Package 300 shows a side view of a substrate 302 that includes a first buildup layer 304 on top of the first side of a core 306, with a second buildup layer 308 on the second side of the core 306. A first routing layer 310 on top of the first buildup layer 304 is communicatively coupled with a second routing layer 312 on the bottom of the second buildup layer 308.

This is accomplished in this legacy implementation by creating a first radiating element 330 on a top side of the core 306 and a second radiating element 332 on the bottom side of the core 306. In implementations, a matching network 334 is electrically coupled with the first routing layer 310 and is proximate to the first radiating element 330. A matching network 336 is electrically coupled with the second routing layer 312 and is proximate to the second radiating element 332. During operation, noncontact signals will be communicated between the first radiating element 330 and the second radiating element 332. In this legacy implementation the matching element can consist of a single patch element or a dual stacked patch element as shown in FIG. 3. Several other matching techniques can be employed (not shown), including microstrip to taper-slot techniques and probe-feeding techniques.

Thus, the first routing layer 310 is communicatively coupled with the second routing layer 312. A number of grounded conductive vias 320a, 320b are placed within the core 306 and surround a volume of the core 306 between the first radiating element 330 and the second radiating element 332.

View 350 shows a top-down view of the core 306 that includes the grounded conductive vias 320a-320j that surround a volume of the core 306 between the first radiating element 330 and the second radiating element 332. The discrete grounded conductive vias 320a-320j form a quasi-waveguide for the transmissions between the first radiating element 330 and the second radiating element 332.

The legacy implementations described with respect to FIGS. 2-3 have challenges. For example, very high bandwidth transmission through an on-package signal line is either restricted to the die side of the package only, or very narrow band as a result of the multiple resonances from the plated through holes serving to form a quasi-waveguide. The dimensions of such transitions are rather large leading to reduced bandwidth density through the substrate core. In addition, due to the use of discrete vias the broadcasted signal is susceptible to cross-talk.

Figure 4:
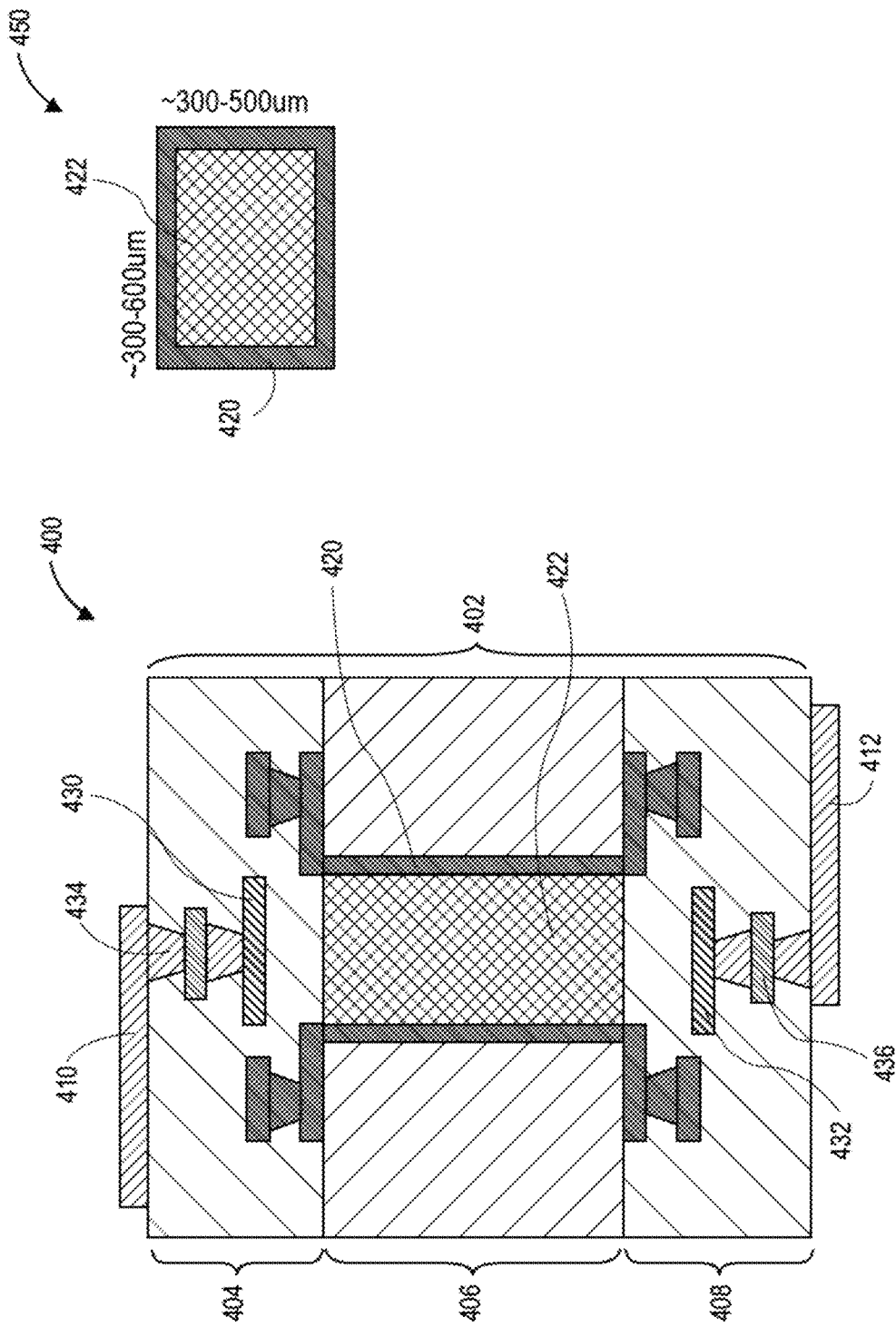
FIG. 4 illustrates a side view and a top view of a contactless through package transmission with a metal ring that extends through the core and surrounds a waveguide, in accordance with various embodiments.

FIG. 4 illustrates a side view and a top view of a contactless through package transmission with a metal ring that extends through the core and surrounds a waveguide, in accordance with various embodiments. Package 400 shows a side view of a substrate 402, that includes a package core 406, a top buildup layer 404 coupled with the top of the package core 406, and a bottom buildup layer 408 coupled with the bottom of the package core 406.

A metal ring 420 extends through the package core 406 from the top buildup layer 404 to the bottom buildup layer 406. In embodiments, the metal ring 420 may be made of copper, gold, aluminum, nickel, ruthenium, titanium, silver, platinum, tungsten, or of some other suitable conductive material. In embodiments, the metal ring 420 will be filled with a waveguide material to form waveguide 422. In embodiments, the waveguide may include a dielectric, or may include multiple rings or sections of different dielectric material as discussed below with respect to FIG. 7.

A top radiating element 430 may be positioned above the waveguide 422, and the bottom radiating element 432 may be positioned below the waveguide 422. During operation, the radiating elements 430, 432 will transmit signals to and/or receive signals from each other, and will be facilitated by the waveguide 422 that is protected by the metal ring 420. The upper radiating element 430 may be electrically coupled with an upper trace 410 on top of the top buildup layer 404. A matching network 434 may be electrically coupled with the upper trace 410 and the radiating element 430. Similarly, the lower radiating element 432 may be electrically coupled with a trace 412 on the bottom of the lower buildup layer 408. A matching network 436 may be electrically coupled with the lower trace 412 and the radiating element 432.

In embodiments, the top matching network 434, top radiating element 430, waveguide 422, bottom radiating element 432, and bottom matching network 436 may be referred to as an interconnect that is used for mm-wave and THz signaling through the package 400.

Package portion 450 shows a top-down view of the core 406, with the metal ring 420 that surrounds the waveguide 422. In embodiments, the shape of the metal ring 420 may be rectangular as shown, or may have rounded corners. In embodiments, the shape of the metal ring 420 may be a circular or elliptical shape, a polygonal shape, or an irregular shape. In embodiments, the metal ring 420 and the waveguide 422 may extends substantially perpendicularly from a top side of the core 406 to a bottom side of the core 406. In other embodiments, the metal ring 420 may extend at a slant through the core 406, or may change its cross-sectional profile through the core 406, for example widening in the middle or widening near the edges of the core 406.

In embodiments, the radiating elements 430, 432 may be a multilayer patch or other antenna-like structure designed to exhibit a desired frequency range of operation such as 100-140 GHz, 110-170 GHz, 170-240 GHz, 220-325 GHz, etc. The transmission lines such as traces 410, 412, matching networks 434, 436, and radiating elements 430, 432 may be formed using conductive metal layers and vias in the build up layers 404, 408. The core 406 may be an organic material such as a copper clad laminate (CCL) or an inorganic material such as glass, ceramic or silicon.

Figure 5:
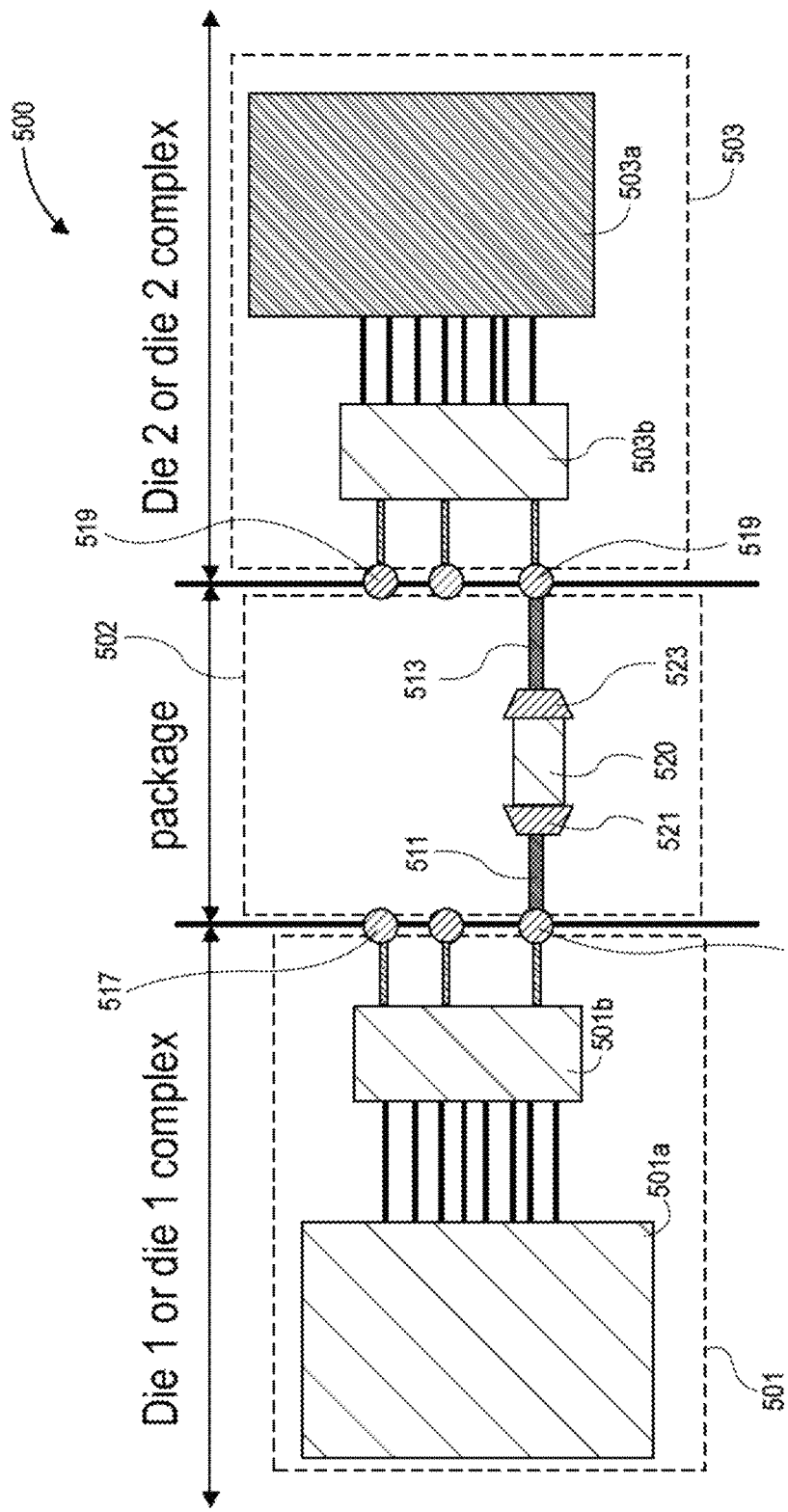
FIG. 5 illustrates a general architecture of a millimeter-wave (mm-wave) and/or terahertz (THz) interconnect with contactless through package transmission using a metal ring that extends through the core, in accordance with various embodiments.

In embodiments, the waveguide 422 may be formed by first creating a through hole inside the core 406 of the substrate, which may be performed by a mechanical or laser drill for CCL or by laser-assisted glass etching techniques described above with respect to FIG. 1. The side walls of the waveguide holes are then metallized using plating technology to create metal ring 420. The plated hole may then be filled with a dielectric material to form the waveguide 422. Various techniques may be used to fill the through holes such as screen printing, spray deposition, plugging etc. Material with high dielectric constant may be used to reduce the cross-section of the waveguide and therefore increase the integration density and achieve higher bandwidth density compared to legacy implementations FIG. 5 illustrates a general architecture of a millimeter-wave (mm-wave) and/or terahertz (THz) interconnect with contactless through package transmission using a metal ring that extends through the core, in accordance with various embodiments. System 500 shows a first die complex 501 that is communicatively coupled with a second die complex 503 via a package 502. Package 502, in embodiments, includes interconnects used for mm-wave and THz signaling. Package 502 may be similar to package 400 of FIG. 4.

In system 500, the first die complex 501 may be a compute die complex that includes a compute die 501a that is coupled with a radiofrequency transceiver 501b. The second die complex 503 may be a storage die complex that includes a storage die 503a that is coupled with a radiofrequency transceiver 503b. In embodiments, the first die complex 501 and the second die complex 503 may be located either on different packages or on different sides of the same package.

The signal from the first die complex 501 may be up-converted to a mm-wave or THz signal using a THz transceiver 501b. The up-converted signal is then routed to the package 502 through on-die transmission lines, such as first level interconnects 517 between the first die complex 501 and the package 502. Once on package 502, the signal is first routed using routings 511, which may include upper trace 410 of FIG. 4, through transmission lines 511 to a first launcher 521. In embodiments, the first launcher 521 may include the upper matching network 434 and upper radiating element 430 of FIG. 4. The launcher 521 acts as radiating elements that couple the signal efficiently into the on-package waveguide 520, which may be similar to waveguide 422 of FIG. 4, to a receiving launcher 523. From the receiving launcher 523, which may include lower matching network 436 and lower radiating element 432 of FIG. 4, the signal is then routed via on-package transmission line 513 and on-die interconnects 519 to the receiving transceiver 503b that down-converts and processes the received signal. In embodiments, the processing may include producing a digital or an analog signal. This processed signal is then sent to the storage die 503a.

Figure 6:
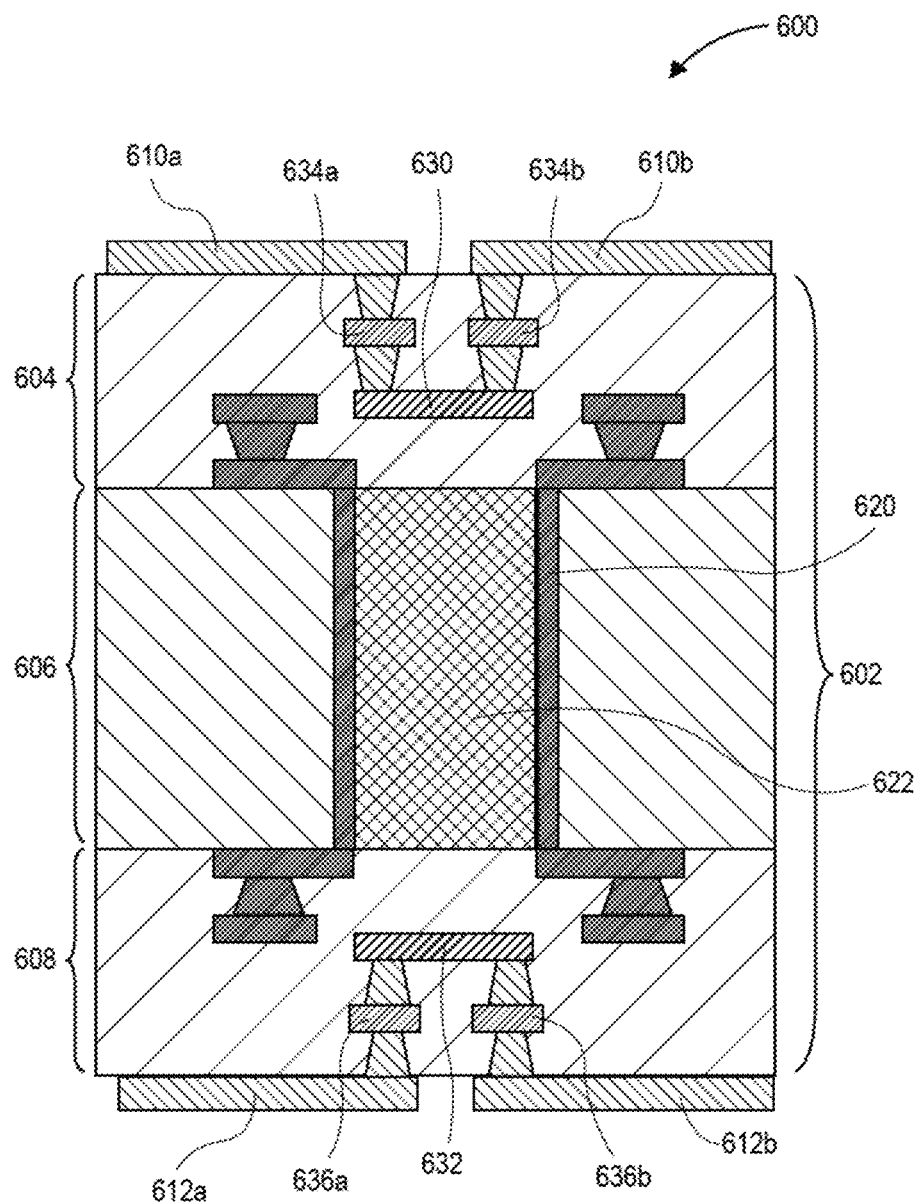
FIG. 6 illustrates a side view of a dual polarization contactless through package transmission with a metal ring that extends through the core, in accordance with various embodiments.

FIG. 6 illustrates a side view of a dual polarization contactless through package transmission with a metal ring that extends through the core, in accordance with various embodiments. Package 600 includes a substrate 602, a core 606, top build up layers 604, and bottom build-up layer 608, which may be similar to substrate 402, core 406, top build-up layer 404, and bottom build-up layer 408 of FIG. 4. Two top traces 610a, 610b that are connected, respectively, to a first polarized signal and a second polarized signal, may be electrically coupled, respectively, to separate top matching networks 634a, 634b. The top matching networks 634a, 634b may be coupled with a top radiating element 630, that may be similar to bottom radiating element 430 of FIG. 4, above waveguide 622 that may be surrounded by metal ring 620.

Similarly, two bottom traces 612a, 612b that are connected, respectively, to a first polarized signal and a second polarized signal, may be electrically coupled, respectively, to separate bottom matching networks 636a, 636b. The bottom matching networks 636a, 636b, which may be referred to as launchers, may be coupled with a bottom radiating element 632, that may be similar to bottom radiating element 432 of FIG. 4, below waveguide 622. During operation, up to 2 times data rate improvement over single polarization embodiments may be achieved from dual polarization implementations. The improvement is practically limited through the achievable cross-polarization performance of the dual polarized launchers 636a, 636b.

Figure 7:
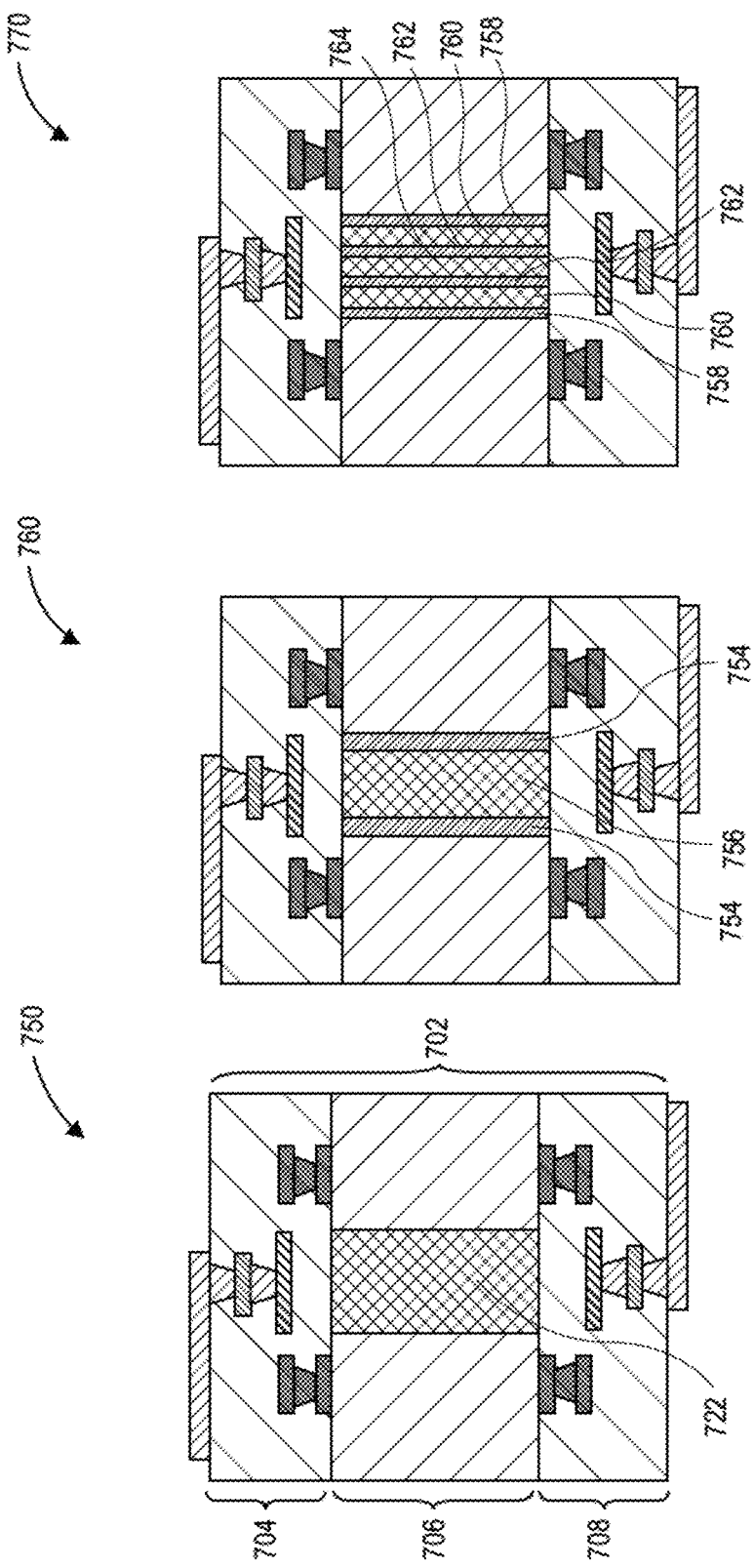
FIG. 7 illustrates a side view of multiple dual polarization contactless through package transmission with a metal ring that includes different types of waveguides, in accordance with various embodiments.

FIG. 7 illustrates a side view of multiple dual polarization contactless through package transmission with a metal ring that includes different types of waveguides, in accordance with various embodiments. Package 750, which may be similar to package 400 of FIG. 4, includes a substrate 702, a top build-up layer 704, a core 706, and a bottom build-up layer 708, with a waveguide 722 through the core 706. This may be similar to substrate 402, top build-up layer 404, core 406, bottom build-up layer 408, and waveguide 422 of FIG. 4. Unlike package 400, package 750 does not include a metal ring 420 surrounding the waveguide 422. Waveguide 722 may include a single dielectric material.

Package 760 includes two dielectric materials, a first dielectric 754 and a second dielectric material 756 that are placed within the waveguide in a concentric fashion. Package 770 shows a first dielectric material 758, a second dielectric material 760, a third dielectric material 762, and a fourth dielectric material 764. The dielectric materials 754, 756, 758, 760, 762, 764 may be disposed in a concentric orientation, where each may be of a different material and have a different dielectric constant. Using multiple dielectric materials can potentially lead to a higher signal confinement or can be employed for effective dielectric constant engineering. A typical application may include two materials as shown in 760, where the outer material 754 has a lower dielectric constant as the inner material 756. The outer material may act in this case as the cladding of the dielectric waveguide formed by dielectric material 756. Such configurations without a metal ring but with a dielectric cladding may be useful for signal frequencies beyond 200 GHz, where metallic loss may become prohibitive and may dominate the link budget.

Figure 8:
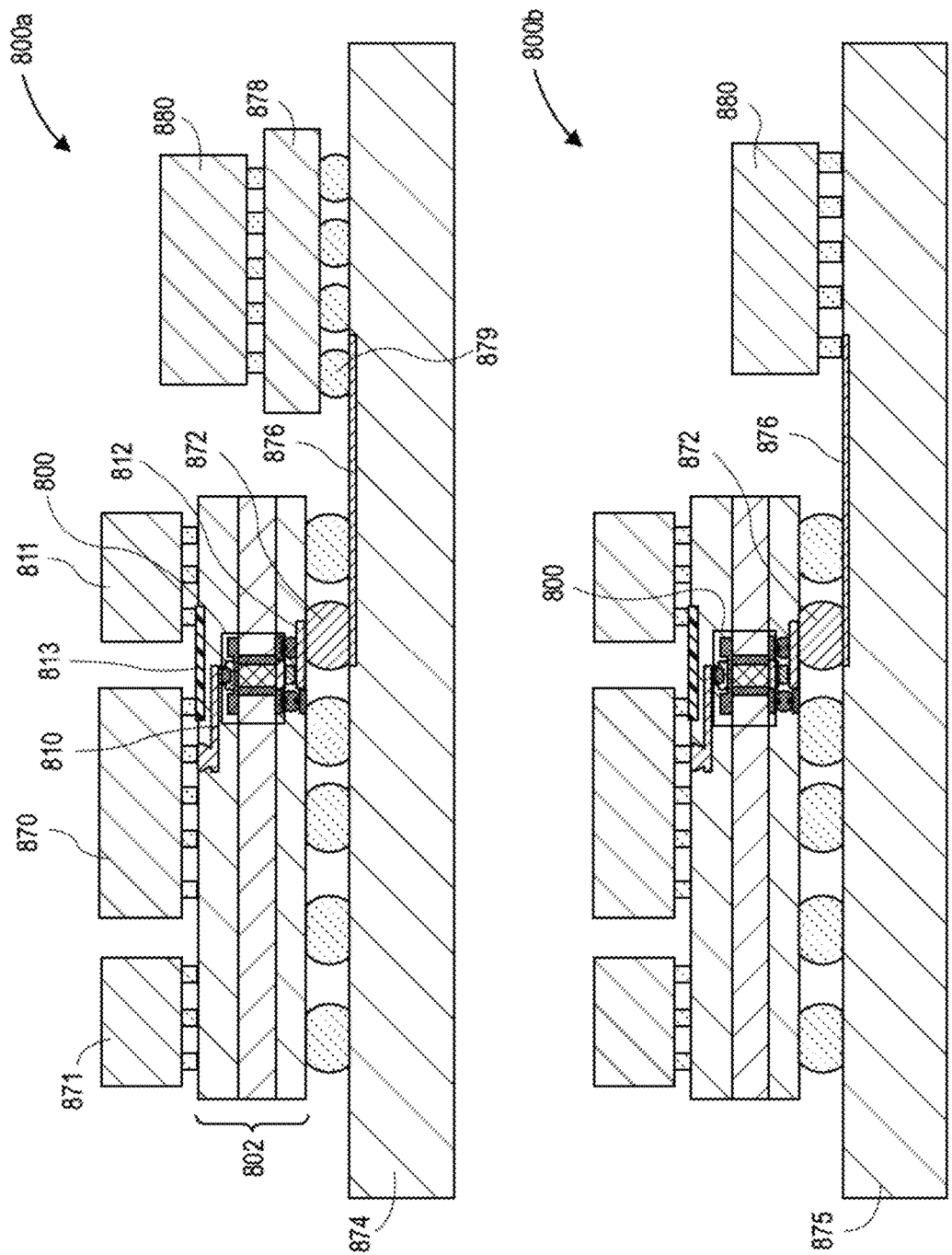
FIG. 8 illustrates a side view of a package that uses contactless through package transmission with a metal ring that extends through the core to communicate with other packages and dies, in accordance with various embodiments.

FIG. 8 illustrates a side view of a package that uses contactless through package transmission with a metal ring that extends through the core to communicate with other packages and dies, in accordance with various embodiments. System 800a includes a printed circuit board (PCB) 874 on to which a substrate 802, which may be similar to substrate 402 of FIG. 4, is physically and electrically coupled. Dies 871, 870, and 811 may be physically and/or electrically coupled with the substrate 802. In embodiments, dies 871, 811 may be dynamic random access memory (DRAM) or high bandwidth memory (HBM) dies, and die 870 may be a compute die. In embodiments, the compute die 870 may be electrically coupled with die 811 using a bridge 813, which may include an embedded multi-die interconnect bridge (EMIB), an omnidirectional interconnect (ODI), a zero misalignment via (ZMV), an on-package high-density interconnect or some other bridging technology.

Another package 878 may be electrically and physically coupled with the PCB 874. Another die 880, which may be a satellite dynamic random access memory die or high bandwidth memory die, maybe electrically and physically coupled to the other package 878. As shown, the compute die 870 may be communicatively coupled with the satellite DRAM or HBM 880 by way of a trace 810, which may be similar to top trace 410 of FIG. 4, that is electrically coupled with a portion of the package 800, which may be similar to package 400 of FIG. 4, which is then electrically coupled with the bottom trace 812 which may be similar to bottom trace 412 of FIG. 4. The bottom trace 812 may then be electrically coupled with the PCB 874 using solder ball 872, which is electrically coupled with a PCB trace 876, that is electrically coupled to the satellite die 880 via solder ball 879 and other package 878.

System 800b may be similar to system 800a, except that the PCB 874 is instead an interposer 875, and the satellite dynamic random access memory 880 is directly physically coupled with the interposer 875 and electrically coupled with the interposer trace 876.

It should be appreciated that the embodiments described herein enable high-speed and high-bandwidth interconnects which are not feasible in legacy implementation due to bandwidth limitations because of legacy through core transitions. Embodiments may support signal frequencies in excess of 100 GHz.

Figure 9:
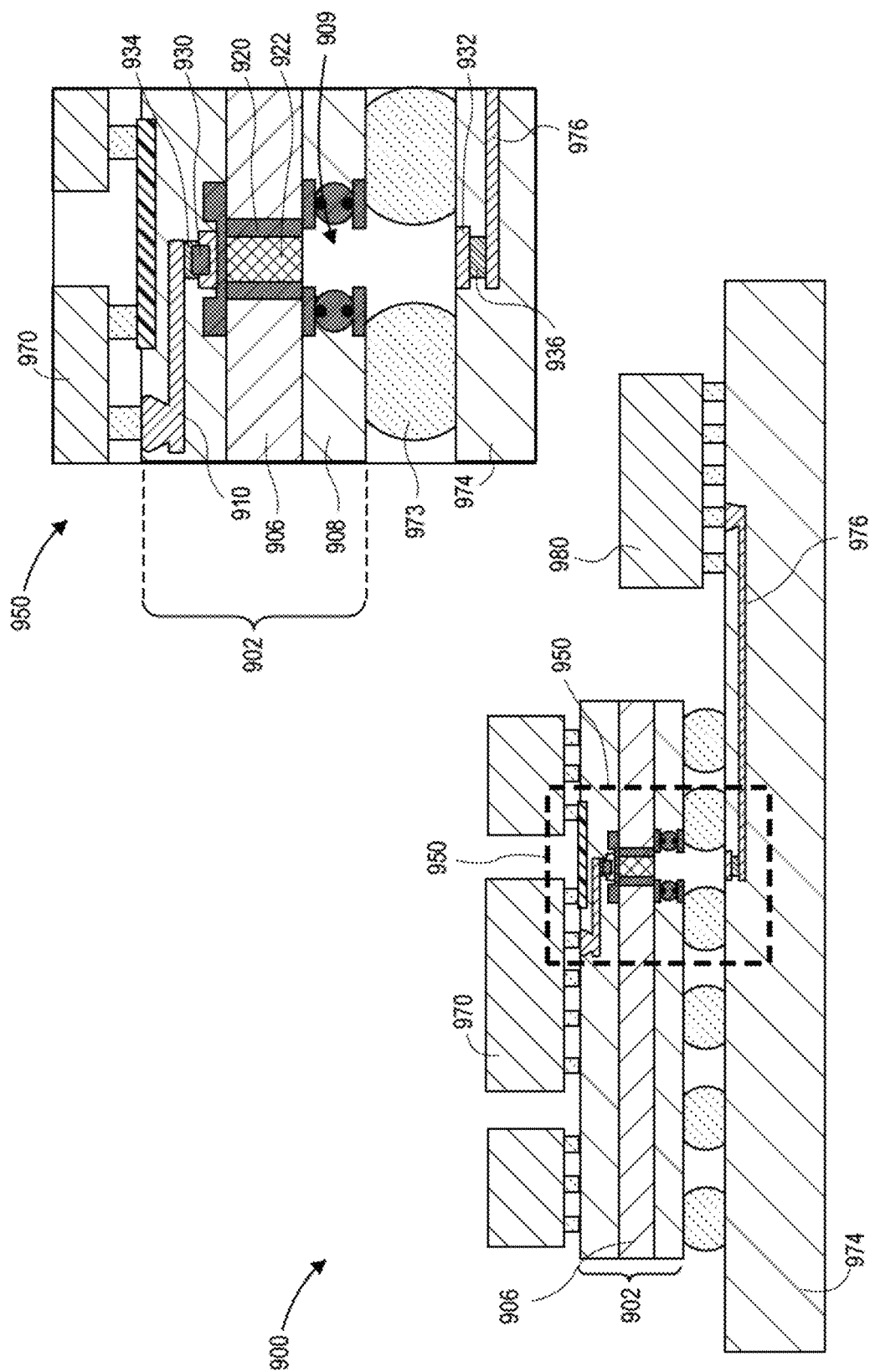
FIG. 9 illustrates a side view of a package that uses contactless through package transmission with a metal ring that extends through the core to communicate with a radiating element on another substrate, in accordance with various embodiments.

FIG. 9 illustrates a side view of a package that uses contactless through package transmission with a metal ring that extends through the core to communicate with a radiating element on another substrate, in accordance with various embodiments. System 900 may be similar to system 800a or 800b of FIG. 8, however the top radiating element 930 and the bottom radiating element 932 may be on different packages or different substrates. Compute die 970 may be communicatively coupled with a satellite dynamic random access die 980 using a contactless transition as detailed with respect to diagram 950.

Diagram 950 shows a portion of a compute die 970 that is electrically coupled with a top trace 910, that may be similar to top trace 410 of FIG. 4. The top trace 910 is electrically coupled with a top matching network 934, which is electrically coupled with a top radiating element 930, which is positioned above waveguide 922 within substrate 902 and core 906, which may be similar to substrate core 406 of FIG. 4. The waveguide 922 is surrounded by a metal ring 920, which may be similar to metal ring 420 of FIG. 4. Metal ring 920 may be electrically coupled with a ground (not shown).

Below the waveguide 922 there may be a cavity 909 made within the bottom build up layer 908, which may be similar to bottom build up layer 408 of FIG. 4. An open air or epoxy filled space may extend from the cavity 909 to the top surface of the interposer 974, at which the bottom radiating element 932 may be placed. A bottom matching network 936 may be electrically coupled with the bottom radiating element 932, which may be electrically coupled to an interposer trace 976, which may be similar to bottom trace 412 of FIG. 4, that is electrically coupled with the die 980.

The top radiating element 930, the waveguide 922, the metal ring 920, and the bottom radiating element 932 are aligned and designed in such a way to maximize the contactless transmission speed and bandwidth. In this embodiment the signal will reach matching element 936 on the PCB or interposer 974 without the need to go through a conductive solder ball 973. This leads to lower insertion loss but also to improved bandwidth compared to legacy implementations. In another embodiment solder ball 973 can be of any shape including but not limited to rectangular or polygonal.

Solder ball 973 typically exhibit a large impedance mismatch at the interface between substrate 902 and interposer 974 which would limit the bandwidth and increase the signal transition insertion loss if the signal was passed through solder ball 973. Moreover, due to the larger size of solder ball 973, interface resonances are often present which further limit the bandwidth of the interconnect.

Figure 10:
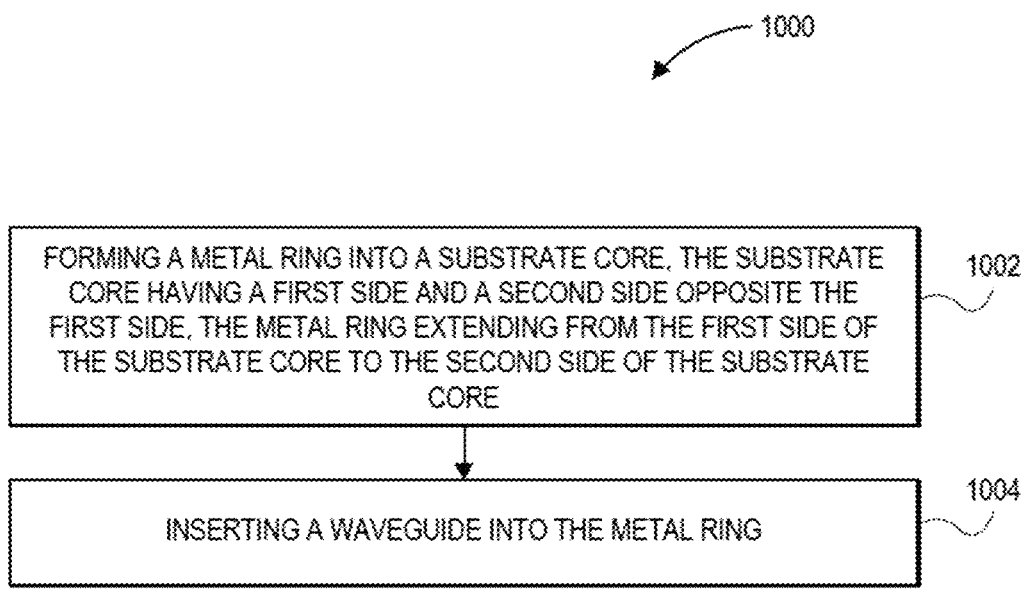
FIG. 10 illustrates an example process to build a substrate core that includes a waveguide surrounded by a metal ring that extends through the core, in accordance with various embodiments.

FIG. 10 illustrates an example process to build a substrate core that includes a waveguide surrounded by a metal ring that extends through the core, in accordance with various embodiments. Process 1000 may be performed using the techniques, apparatus, systems, and methods described herein and in particular with respect to FIGS. 1-9.

At block 1002, the process may include forming a metal ring into a substrate core, the substrate core having a first side and a second side opposite the first side, the metal ring extending from the first side of the substrate core to the second side of the substrate core. In embodiments, substrate core may be similar to substrate core 406 of FIG. 4, 606 of FIG. 6, 706 of FIG. 7, or 906 of FIG. 9, and the metal ring may be similar to metal ring 420 of FIG. 4, 620 of FIG. 6, 720 of FIG. 7, or 920 of FIG. 9.

At block 1004, the process may further include inserting a waveguide material such as a dielectric material into the metal ring. In embodiments, the waveguide may include one or more dielectrics as described above, and may be similar to waveguide 422 of FIG. 4, 626 of FIG. 6, or 926 of FIG. 9.

Figure 11:
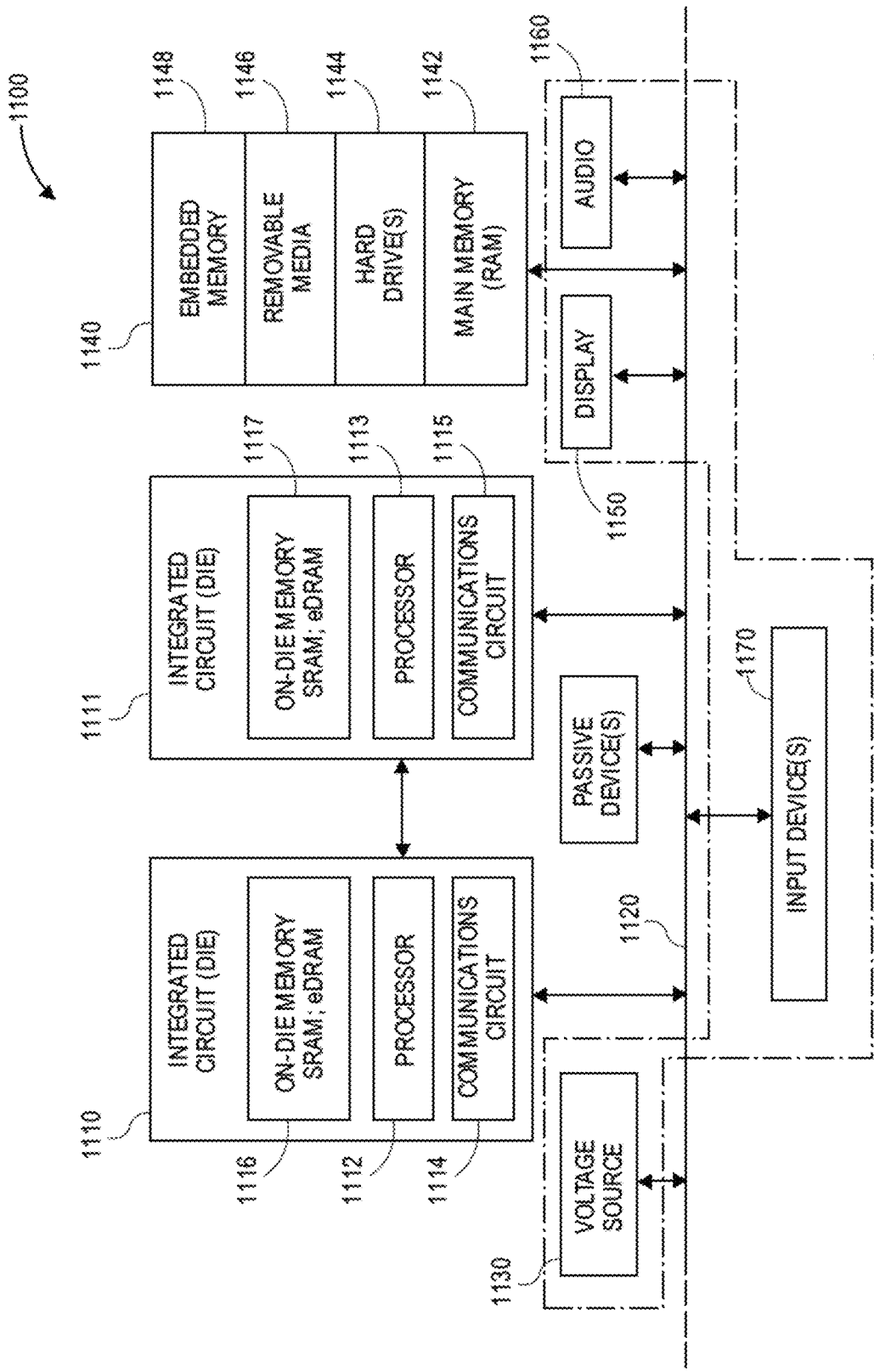
FIG. 11 schematically illustrates a computing device, in accordance with embodiments.

FIG. 11 schematically illustrates a computing device, in accordance with embodiments. FIG. 11 is a schematic of a computer system 1100, in accordance with an embodiment of the present invention. The computer system 1100 (also referred to as the electronic system 1100) as depicted can embody contactless communications using a waveguide extending through a substrate core, according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader. The computer system 1100 may be a server system. The computer system 1100 may be a supercomputer or high-performance computing system.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, contactless communications using a waveguide extending through a substrate core, as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1110 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In an embodiment, the electronic system 1100 also includes a display device 1150, an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including a package substrate having contactless communications using a waveguide extending through a substrate core, according to any of the several disclosed embodiments and their equivalents, an electronic system, a computer system, one or more methods of fabricating an integrated circuit, and one or more methods of fabricating an electronic assembly that includes a package substrate having contactless communications using a waveguide extending through a substrate core, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having contactless communications using a waveguide extending through a substrate core embodiments and their equivalents. A foundation substrate may be included, as represented by the dashed line of FIG. 11. Passive devices may also be included, as is also depicted in FIG. 11.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a package comprising: a substrate with a core, the core having a first side and a second side opposite the first side; a metal ring extending from the first side of the core to the second side of the core; and a waveguide disposed within the metal ring.

Example 2 includes the package of example 1, wherein the metal ring is a plated through cavity within the core.

Example 3 includes the package of example 1, wherein the metal ring includes a selected one or more of copper, gold, aluminum, nickel, ruthenium, titanium, silver, platinum, or tungsten.

Example 4 includes the package of example 1, wherein the core includes a selected one of: copper clad laminate layer, glass, ceramic, or silicon.

Example 5 includes the package of example 1, wherein the waveguide includes one or more dielectric material.

Example 6 includes the package of example 1, wherein the waveguide includes one or more layers of dielectric material.

Example 7 includes the package of any one of examples 1-6, further comprising: a buildup layer with a first side and a second side opposite the first side, wherein the second side of the buildup layer is coupled with the first side of the core; and a radiating element located in the buildup layer, the radiating element positioned above the waveguide.

Example 8 includes the package of example 7, wherein the buildup layer is a first buildup layer and the radiating element is a first radiating element; and further comprising: a second build up layer coupled with the second side of the core; and a second radiating element in the second build up layer positioned below the waveguide.

Example 9 includes the package of example 8, wherein the first radiating element is electrically coupled with a first signal source with a first polarization and with a second signal source with a second polarization; and wherein the second radiating element is electrically coupled with a third signal source with the first polarization and with a fourth signal source with the second polarization.

Example 10 includes the package of example 7, wherein the substrate is a first substrate and wherein the radiating element is a first radiating element; and further comprising: a second substrate with a first side and a second side opposite the first side, wherein the first side of the second substrate is physically coupled with the second side of the first substrate; and a second radiating element located on the first side of the second substrate and below the waveguide.

Example 11 includes the package of example 7, further comprising a die coupled with the first side of the buildup layer; and wherein the radiating element is electrically coupled with the die.

Example 12 includes the package of example 1, wherein the metal ring is a solid metal ring.

Example 13 is a system comprising: a substrate comprising: a substrate core, the core having a first side and a second side opposite the first side; a metal ring extending from the first side of the core to the second side of the core; a waveguide disposed within the metal ring; and a buildup layer having a first side and a second side opposite the first side, the second side of the buildup layer coupled with the first side of the substrate core, wherein a radiating element is coupled with the buildup layer above the waveguide; and a die coupled with the first side of the buildup layer and electrically coupled with the radiating element.

Example 14 includes the system of example 13, wherein the die is electrically coupled with the radiating element via a redistribution layer (RDL) within the buildup layer.

Example 15 includes the system of any one of examples 13-14, wherein the radiating element is a first radiating element and the buildup layer is a first buildup layer; and further comprising: a second buildup layer having a first side and a second side opposite the first side, the first side of the second buildup layer coupled with the second side of the substrate core, wherein a second radiating element is coupled with the second buildup layer below the waveguide.

Example 16 includes the system of example 15, wherein the substrate is a first substrate, and wherein the die is a first die; and further comprising: a second substrate having a first side and a second side opposite the first side, the first side of the second substrate physically and electrically coupled with the second side of the second buildup layer; and a second die physically and electrically coupled to the first side or the second side of the second substrate, wherein the first die and the second die are communicatively coupled via the waveguide.

Example 17 includes the system of any one of examples 13-16, wherein the substrate core includes a selected one of: copper clad layer, glass, ceramic, or silicon.

Example 18 is a method comprising: forming a metal ring into a substrate core, the substrate core having a first side and a second side opposite the first side, the metal ring extending from the first side of the substrate core to the second side of the substrate core; and inserting a waveguide into the metal ring.

Example 19 includes the method of example 18, further comprising: applying a buildup layer to the first side of the substrate core, the buildup layer including a radiating element above waveguide in the metal ring.

Example 20 includes the method of any one of examples 18-19, wherein forming the metal ring into the substrate core further includes: removing a volume of material from the substrate core, the volume of material extending from the first side of the substrate core to the second side of the substrate core; and plating a metal to a surface between the first side of the substrate core and the second side of the substrate core exposed by removal of the volume of material.

Example 21 includes the subject matter of any one of examples 1-20, or of any embodiment disclosed herein, wherein the waveguide via has no metallic sidewalls.

Example 22 includes the subject matter of any one of examples 1-20, or of any embodiment disclosed herein, wherein multiple dielectrics are in the same waveguide cavity.

What is claimed is:

1. A package comprising:
    a substrate with a core, the core having a first side and a second side opposite the first side;
    a metal ring extending from the first side of the core to the second side of the core;
    a waveguide disposed within the metal ring, the waveguide having an uppermost surface at a same level as the first side of the core, and the waveguide having a bottommost surface at a same level as the second side of the core;
    a buildup layer with a first side and a second side opposite the first side, wherein the second side of the buildup layer is coupled with the first side of the core; and
    a radiating element located in the buildup layer, the radiating element positioned above the waveguide, wherein the buildup layer is a first buildup layer and the radiating element is a first radiating element; and further comprising:
    a second build up layer coupled with the second side of the core;
    a second radiating element in the second build up layer positioned below the waveguide.

2. The package of claim 1, wherein the metal ring is a plated through cavity within the core.

3. The package of claim 1, wherein the metal ring includes a selected one or more of copper, gold, aluminum, nickel, ruthenium, titanium, silver, platinum, or tungsten.

4. The package of claim 1, wherein the core includes a selected one of: copper clad laminate layer, glass, ceramic, or silicon.

5. The package of claim 1, wherein the waveguide includes one or more dielectric material.

6. The package of claim 1, wherein the waveguide includes one or more layers of dielectric material.

7. The package of claim 1, wherein the first radiating element is electrically coupled with a first signal source with a first polarization and with a second signal source with a second polarization; and wherein the second radiating element is electrically coupled with a third signal source with the first polarization and with a fourth signal source with the second polarization.

8. The package of claim 1, wherein the substrate is a first substrate and wherein the radiating element is a first radiating element; and further comprising:
    a second substrate with a first side and a second side opposite the first side, wherein the first side of the second substrate is physically coupled with the second side of the first substrate;
    a second radiating element located on the first side of the second substrate and below the waveguide.

9. The package of claim 1, further comprising a die coupled with the first side of the buildup layer; and wherein the radiating element is electrically coupled with the die.

10. The package of claim 1, wherein the metal ring is a solid metal ring.

11. A system comprising:
    a substrate comprising:
        a substrate core, the core having a first side and a second side opposite the first side;

a metal ring extending from the first side of the core to the second side of the core;

a waveguide disposed within the metal ring, the waveguide having an uppermost surface at a same level as the first side of the core, and the waveguide having a bottommost surface at a same level as the second side of the core; and a buildup layer having a first side and a second side opposite the first side, the second side of the buildup layer coupled with the first side of the substrate core, wherein a radiating element is coupled with the buildup layer above the waveguide; and a die coupled with the first side of the buildup layer and electrically coupled with the radiating element, wherein the die is electrically coupled with the radiating element via a redistribution layer (RDL) within the buildup layer.

12. The system of claim 11, wherein the radiating element is a first radiating element and the buildup layer is a first buildup layer; and further comprising:

a second buildup layer having a first side and a second side opposite the first side, the first side of the second buildup layer coupled with the second side of the substrate core, wherein a second radiating element is coupled with the second buildup layer below the waveguide.

13. The system of claim 12, wherein the substrate is a first substrate, and wherein the die is a first die; and further comprising:

a second substrate having a first side and a second side opposite the first side, the first side of the second substrate physically and electrically coupled with the second side of the second buildup layer;

a second die physically and electrically coupled to the first side or the second side of the second substrate, wherein the first die and the second die are communicatively coupled via the waveguide.

14. The system of claim 11, wherein the substrate core includes a selected one of: copper clad layer, glass, ceramic, or silicon.

15. A package comprising:

a substrate with a core, the core having a first side and a second side opposite the first side;

a metal ring extending from the first side of the core to the second side of the core;

a waveguide disposed within the metal ring, the waveguide having an uppermost surface at a same level as the first side of the core, and the waveguide having a bottommost surface at a same level as the second side of the core;

a buildup layer with a first side and a second side opposite the first side, wherein the second side of the buildup layer is coupled with the first side of the core; and a radiating element located in the buildup layer, the radiating element positioned above the waveguide, wherein the substrate is a first substrate and wherein the radiating element is a first radiating element; and further comprising:

a second substrate with a first side and a second side opposite the first side, wherein the first side of the second substrate is physically coupled with the second side of the first substrate;

a second radiating element located on the first side of the second substrate and below the waveguide.

16. A package comprising:

a substrate with a core, the core having a first side and a second side opposite the first side;

a metal ring extending from the first side of the core to the second side of the core;

a waveguide disposed within the metal ring, the waveguide having an uppermost surface at a same level as the first side of the core, and the waveguide having a bottommost surface at a same level as the second side of the core;

a buildup layer with a first side and a second side opposite the first side, wherein the second side of the buildup layer is coupled with the first side of the core;

a radiating element located in the buildup layer, the radiating element positioned above the waveguide; and a die coupled with the first side of the buildup layer; and wherein the radiating element is electrically coupled with the die.

17. A system comprising:

a substrate comprising:

a substrate core, the core having a first side and a second side opposite the first side;

a metal ring extending from the first side of the core to the second side of the core;

a waveguide disposed within the metal ring, the waveguide having an uppermost surface at a same level as the first side of the core, and the waveguide having a bottommost surface at a same level as the second side of the core; and a buildup layer having a first side and a second side opposite the first side, the second side of the buildup layer coupled with the first side of the substrate core, wherein a radiating element is coupled with the buildup layer above the waveguide; and a die coupled with the first side of the buildup layer and electrically coupled with the radiating element, wherein the radiating element is a first radiating element and the buildup layer is a first buildup layer; and further comprising:

a second buildup layer having a first side and a second side opposite the first side, the first side of the second buildup layer coupled with the second side of the substrate core, wherein a second radiating element is coupled with the second buildup layer below the waveguide.

18. The system of claim 17, wherein the substrate is a first substrate, and wherein the die is a first die; and further comprising:

a second substrate having a first side and a second side opposite the first side, the first side of the second substrate physically and electrically coupled with the second side of the second buildup layer;

a second die physically and electrically coupled to the first side or the second side of the second substrate, wherein the first die and the second die are communicatively coupled via the waveguide.

* * * * *